United States Patent
Emoto

(10) Patent No.: US 6,441,476 B1
(45) Date of Patent: Aug. 27, 2002

(54) FLEXIBLE TAPE CARRIER WITH EXTERNAL TERMINALS FORMED ON INTERPOSERS

(75) Inventor: Yoshiaki Emoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/690,603

(22) Filed: Oct. 18, 2000

(51) Int. Cl.⁷ ............................................. H01L 23/02
(52) U.S. Cl. ...................................... 257/686; 438/109
(58) Field of Search .................. 257/686, 735; 438/109

(56) References Cited

U.S. PATENT DOCUMENTS

| | | | | |
|---|---|---|---|---|
| 5,394,303 A | * | 2/1995 | Yamaji | 361/749 |
| 5,895,970 A | * | 4/1999 | Miyoshi | 257/696 |
| 6,022,759 A | * | 2/2000 | Seki et al. | 438/123 |
| 6,028,365 A | * | 2/2000 | Akram et al. | 257/778 |
| 6,225,688 B1 | * | 5/2001 | Kim et al. | 257/686 |
| 6,300,679 B1 | * | 10/2001 | Mukerji et al. | 257/738 |
| 2001/0015652 A1 | * | 8/2001 | Eldridge et al. | 324/761 |
| 2001/0022396 A1 | * | 9/2001 | Distefano et al. | 257/723 |

FOREIGN PATENT DOCUMENTS

| | | |
|---|---|---|
| JP | 6-204399 | 7/1994 |
| JP | 6-334098 | 12/1994 |
| JP | 8-167630 | 6/1996 |

* cited by examiner

Primary Examiner—Richard Elms
Assistant Examiner—Christian D. Wilson
(74) Attorney, Agent, or Firm—Oliff & Berridge, PLC

(57) ABSTRACT

In order to provide a semiconductor apparatus in which both semiconductor chips and interposers are provided on a carrier tape, electrical properties can be improved using short wiring in a wiring pattern substantially symmetric with respect to the semiconductor chips, production can become easier, and compactness and heat radiation can be improved. Semiconductor chips electrically connected to wiring formed on the carrier tape, and interposers on the carrier tape and surrounding the semiconductor chips, are provided next to each other.

7 Claims, 7 Drawing Sheets

FLEXIBLE TAPE CARRIER WITH EXTERNAL TERMINALS FORMED ON INTERPOSERS

BACKGROUND OF THE INVENTION

1. Field of the Invention

The present invention relates to a semiconductor apparatus, and more particularly to a semiconductor apparatus such that the electrical properties have been improved using thin wiring with a substantially symmetric wiring pattern with respect to the semiconductor chip, production is easy, and it is possible to improve heat radiation while being compact.

2. Description of Related

In recent years, accompanying a demand for more compact, higher performance electronic equipment, semiconductor apparatuses with multiple pins yet being compact have been sought through larger scale integration of semiconductor chips themselves. In addition, accompanying the demand for greater compactness and higher performance, greater compactness and higher performance of semiconductor apparatuses have been targeted by using multi-chip packages (MCPs) in which a plurality of semiconductor chips are arranged inside a single package. As an apparatus targeting the above-described compactness and multiple pin features, a semiconductor apparatus has been proposed for example in Japanese Laid-Open Patent Publication 6-334098. As shown in FIG. 11 and FIG. 12, this semiconductor apparatus 110 is formed by joining a heat radiation plate 117 and a flexible wiring board 116, joining a package main body 112 composed of a multilayer printed circuit board on the surface opposite that of the joined area of the heat radiation plate 117, and bending back the flexible wiring board 116 that extends to the outside of the package main body 112 and joining this board to the surface side where a cavity 115 in the package main body 112 has been formed. As shown in FIG. 12, a semiconductor apparatus formed in this manner is composed such that heat radiating fins 117a are already attached to the heat radiating board 117, and lead pins are joined as an external connection terminal 118 via the circuit board 116a such as the printed circuit board, to the outer surface of the flexible wiring board 116 joined to the package main body 112.

In addition, among the above-described multi-chip packages in which a plurality of semiconductor chips are arranged within a single package, there are flat MCPs in which the plurality of semiconductor chips are lined up in a planar surface, and stacked MCPs in which the plurality of semiconductor chips are stacked in the direction of thickness. Flat MCPs in which the semiconductor chips are lined up in a planar surface require a large mounting surface area, and hence contribute little to increasing the compactness of electronic equipment. Consequently, development of stacked MCPs in which the semiconductor chips are stacked is being conducted in abundance. As an example, there is technology, such as that disclosed in Japanese Laid-Open Patent Publication 6-204399 and Japanese Laid-Open Patent Publication 8-167630, wherein modules are formed by stacking semiconductor chips vertically after sealing such inside a package, and electrical connection between packages is accomplished using via holes and through holes.

SUMMARY OF THE INVENTION

In the aforementioned semiconductor apparatus of Japanese Laid-Open Patent Publication 6-334098, assembly is complicated because the apparatus is produced joining the package main body 112, in which a cavity 115 is formed and printed boards having a set wiring pattern formed in advance are stacked up to one side of the flexible printed circuit board 116, creating the problem that the result effectively cannot be made compact.

In addition, with a conventional stacked MCP, it is necessary to form via holes and through holes for accomplishing inter-layer connection in order to electrically connect the semiconductor chips and the wiring board, and hence production processes, such as positioning between layers, processing holes, filling holes with a conductor or plating process, are difficult. Consequently, apparatuses have been proposed in which the semiconductor chips are mounted on an insulating film tape in which copper wiring has been provided without using complex production processes such as for via holes and through holes and the like, and the stacked semiconductor chips are electrically connected, for example Japanese Laid-Open Patent Publication 8-167630. In a semiconductor module which may include at least a single semiconductor chip, a substrate on which such is mounted, and wiring electrically connected to said semiconductor chip formed on this substrate, multi-layering is accomplished by folding the above-described substrate, and the space between layers of the substrate are adhered by an adhesion element. In addition, between the folded layers, a heat dispersion board is placed and heat is dispersed. In addition, it is noted that between the folded layers, a board is placed to secure rigidity, the rigidity of the semiconductor module is increased, rising of solder balls through deformations such as flexing is prevented, and the electrical connection between the semiconductor module and the wiring board is made certain. However, in that disclosure, the board is folded from the area of the ridge folding lines and the valley folding lines to accomplish multilayering, and furthermore, a semiconductor chip is placed within the same empty space as the valley folding lines area, while within this empty space, the active surfaces of the semiconductor chips are positioned facing each other. Consequently, the substrate is such that with the ridge folding lines, enlargement becomes necessary because of the fear that breaking of the wiring or the like could arise if the bending radius is reduced, and in addition, because these ridge folding lines exist in a plurality of locations, the semiconductor module becomes thick. Moreover, the heat generated from the mutually facing semiconductor chips acts on each, and furthermore, the temperature is raised and abnormal operation occurs in the semiconductor chips, and eventually, abnormalities are caused in the semiconductor modules as a result of this. In particular, when the active surfaces of the semiconductor chips are placed in positions facing each other, this heat acts mutually and abnormal operations occur easily. For this reason, in the disclosure a heat dispersion board is placed between the semiconductor chips and the heat is dispersed, but because this is placed in contact with the active surfaces, there is no change in the mutual action of the heat generated by the semiconductor chips via the heat dispersion board, the temperature does not go down enough, so the temperature rises and abnormal operation is caused in the semiconductor chip, while the problem also remains that the package is large.

In consideration of the foregoing, it is an objective of the present invention to provide a semiconductor apparatus wherein a semiconductor chip and an interposer are both placed besides each other on a carrier tape, and in which the electrical properties are improved using short wiring with a wiring pattern substantially symmetric with respect to the semiconductor chip, production is easy, and which is compact with improved heat radiation. In addition, it is another objective of this invention to obtain a semiconductor apparatus in which the used surface area is reduced using carrier tape on which electronic parts are mounted, and accompanying that, the exterior dimensions of the package as a whole can be reduced, the mounting area can be shrunk, the ease of operation and productivity can be improved and the production cost can be lowered.

In order to accomplish the above objectives, the semiconductor apparatus of the present invention is such that a semiconductor chip connected electrically to wiring formed on a carrier tape, and an interposer provided on the carrier tape and near the semiconductor chip, are provided beside each other, the semiconductor chip and the interposer are overlapped by bending the carrier tape so that the semiconductor chip positioned in the center is enclosed, and the result is covered by a molding.

The present invention as configured in this manner has a carrier tape material with substantially the same length in the left-right direction of the diagrams, and/or the front-back direction, with respect to the semiconductor chip placed in the center, and consequently it is possible to shorten the length of the wiring pattern and improve the electrical properties. In addition, it suffices to bend the short carrier tape symmetric left-to-right the same way on the left and the right, making production easy.

In addition, the semiconductor apparatus of the present invention can have a composition such that a plurality of semiconductor chips arranged in a row and electrically connected to wiring form on the carrier tape, and interposers on the carrier tape and also on both the top and bottom sides of the semiconductor chip arranged in the center thereof, are provided next to each other, and multi-layering is accomplished by bending the carrier tape and overlapping the interposer on one surface of the semiconductor chip in the center and the other semiconductor chips on the other surface, and covering the result with molding resin.

The present invention as configured in this manner has, as noted above, a carrier tape material with substantially the same length in the left-right direction of the diagram with respect to the semiconductor chip placed in the center, and consequently it is possible to shorten the length of the wiring pattern and improve the electrical properties. In addition, it is possible to make the apparatus more compact because the carrier tape and the interposer are positioned adjacent to each other.

In addition, the semiconductor apparatus of the present invention may have the tape material interposer placed on the carrier tape adjacent to the semiconductor chips arranged in a row, while an external connection terminal is provided to the interposer.

The present invention as configured in this manner has a tape material interposer placed on the carrier tape adjacent to the semiconductor chips arranged in a row, while an external connection terminal is provided to the interposer, and consequently, the external connection terminal area is reinforced by the interposer, making the cost cheaper and improving with the wiring of a single layer.

In addition, the semiconductor apparatus of the present invention may be multi-layered by overlapping the active surfaces of the semiconductor chips in the top-to-bottom direction so as to not face each other.

The present invention as configured in this manner can be configured with the active surfaces of the semiconductor chips not facing each other while the semiconductor chips are overlapped and covered with molding resin, and consequently, the semiconductor chips are not placed on a surface with the active surfaces thereof mutually facing, the heat generated from the active surfaces does not mutually work together to raise the heat, and increases in the temperature of the semiconductor chips are reduced. Consequently, abnormal operation does not occur in the semiconductor chip, and the semiconductor module operates properly.

In addition, the semiconductor apparatus of the present invention may also have no carrier tape between the overlapping semiconductor chips.

The present invention as configured in this manner is such that the gap between the stacked semiconductor chips can be reduced by the amount of the carrier tape that has been omitted, making it possible to reduce the thickness of the semiconductor module. In addition, because the carrier tape, which has a poor heat transfer ratio, is not positioned there, the heat radiation of the semiconductor chips improves and the temperature does not rise much, so it is possible to prevent the occurrence of abnormal operations.

DETAILED DESCRIPTION OF PREFERRED EMBODIMENTS

Hereafter, the preferred embodiment of the semiconductor apparatus of the present invention will be described in detail with reference to the attached drawings.

Figure 1:
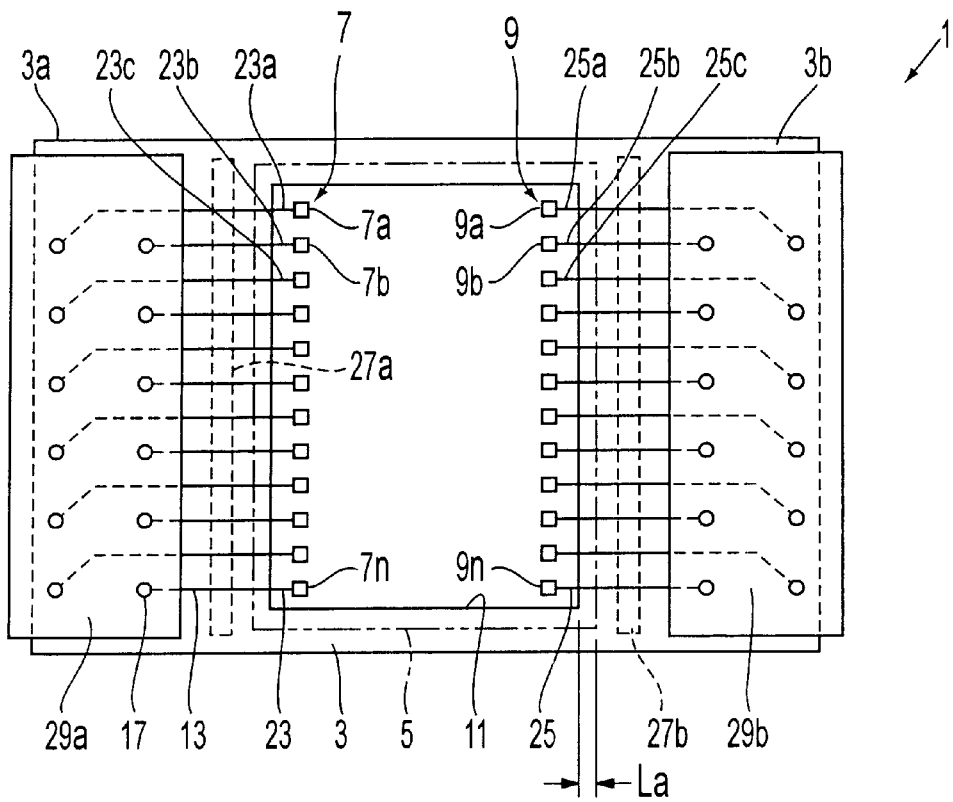
FIG. 1 is an open planar view of the semiconductor apparatus according to a first embodiment of the present invention.
Figure 2:
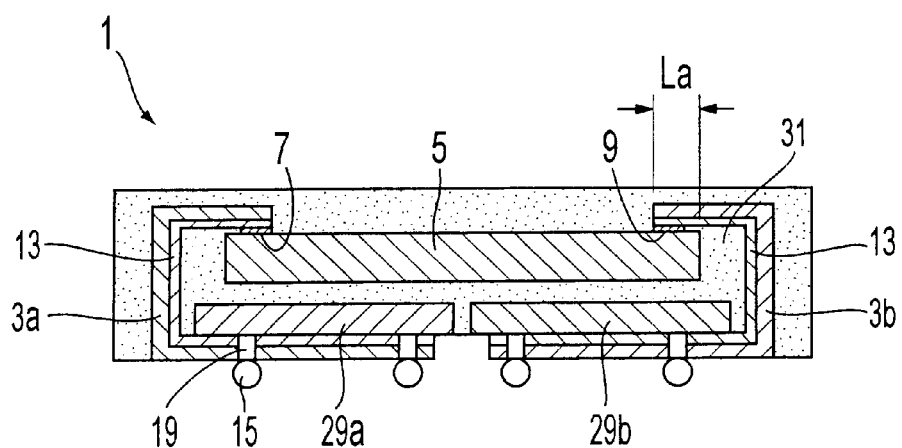
FIG. 2 is a side cross-sectional view of the semiconductor apparatus according to a first embodiment of the present invention.

FIG. 1 is an open planar view of the semiconductor apparatus 1 according to a first embodiment of the present invention, and FIG. 2 is a side cross-sectional view of the semiconductor apparatus 1.

In FIG. 1 or FIG. 2, with the semiconductor apparatus according to the first embodiment, a carrier tape material 3 is used which is rectangular with the long side in the sideways in the figure, and a semiconductor chip 5 (indicated by the broken line) is placed substantially in the center thereof, and interposers 29a and 29b are placed on both sides of this semiconductor chip 5, details of which are explained hereinafter. The semiconductor apparatus 1 is mounted such that the semiconductor chip 5 substantially in the center of the carrier tape material 3 is electrically connected. This semiconductor chip 5 is formed in the shape of a rectangle, and has a plurality of electrodes 7 and 9 in rows near the shorter opposing side in the narrow direction. These electrodes 7 and 9 are for example arranged with the first electrodes 7a, 7b, . . . 7n, on the left side in the diagram, and the second electrodes 9a, 9b, . . . 9n, on the right side. In place of these electrodes, bumps may be used.

On the bottom surface of the tape material 3 where the semiconductor chip 5 is mounted, a device hole 11 is formed so as to overlap with the position of the semiconductor chip 5. The dimensions of this device hole 11 are such that a hole is formed that is smaller than the external shape of the semiconductor chip 5, and the semiconductor chip 5 and the device hole 11 overlap by a predetermined dimension La, and are electrically connected. Through this, the semiconductor apparatus can be made compact. In addition, the device hole 11 may also conversely be made larger than the semiconductor chip 5, and the chip may be anchored by means of an unrepresented adhesive agent.

The carrier tape material 3, uses a flexible, insulating film tape that is composed of a polyimide, polyester or glass epoxy material resin, and is composed so as to be freely bendable. On this carrier tape material 3, copper wiring 13 is formed on one edge side, and a land 17 is formed on which is formed a below-described solder ball 15 on the other edge side. The copper wiring 13 on the one edge side and the solder ball 15 on the other edge side are electrically connected by a through hole 19 provided in the carrier tape material 3. Consequently, in the through hole 19, electrical connection is made by a method of plating the inner surface of the penetrating hole, or a method that fills the inside of the hole with a conductive material, or a method which connects a wire or bar or the like of made of conductive metal material placed in the hole.

The copper wiring 13 forms a predetermined wiring pattern by forming copper foil on an edge of an insulating flexible film, while one end of the wire connects to the corresponding electrodes 7 and 9 of the semiconductor chip 5, and hence is provided so that inner leads 23 and 25 protrude inwardly and pass over the edge of the perimeter of left and right opposing sides in the direction of length of the device hole 11. For these inner leads 23 and 25, on the left side in the diagram inner leads 23a, 23b, 23c and so forth are formed, and on the right side in the diagram inner leads 25a, 25b, 25c and so forth are formed. This copper wiring 13 can also be made by forming a conductive film on the surface of a flexible film through vapor deposition methods or sputtering methods, and by etching the conductive film to form a predetermined wiring pattern. Excluding the land 17 to which the electrodes 7 and 9 and the solder ball 15 are connected, this copper wiring 13 may also be formed with a protective film by coating the wires with resin such as polyimide for protection.

This carrier tape material 3 sandwiches the semiconductor chip 5 which is positioned substantially in the center thereof, and for example, a first carrier tape material 3a is provided on the left side of the diagram and a second carrier tape material 3b is provided on the right side of the diagram. In the first carrier tape material 3a, a first bending part 27a is provided, and in the second carrier tape material 3b, a second bending part 27b is provided. This copper wiring is electrically connected to the solder ball 15 and the electrodes 7 and 9 of the semiconductor chip, for example, using TAB (tape automated bonding) technology. In addition, the copper wiring 13 may be electrically connected to the solder ball 15 and the electrodes 7 and 9 of the semiconductor chip 5 by wire bonding after bonding using an adhesive agent such as an epoxy-based silver paste.

In addition, a first interposer 29a is anchored on the first carrier tape material 3a on the left side in the diagram by an unrepresented adhesive agent, and furthermore, a second interposer 29b is anchored on the second carrier tape material 3b on the right side in the diagram by the unrepresented adhesive agent.

The semiconductor apparatus 1 developed as described above is produced through the following sequence of procedures.

First, as noted above, the semiconductor chip 5 is mounted at a position that overlaps with the device hole 11 formed in the carrier tape material 3. In addition, the electrodes 7 and 9 of the semiconductor chip 5 and the copper wiring of the carrier tape material 3 are electrically connected through TAB technology or wire bonding technology. At both ends of the carrier tape material 3, the first interposer 29a and the second interposer 29b are anchored by an unrepresented adhesive agent. Next, the first bending part 27a of the first carrier tape material 3a and the second bending part 27b of the second carrier tape material 3b, which are provided on both sides of the semiconductor chip 5, are bent at substantially right angles so that the semiconductor chip 5 is delivered between the insides of the two carrier tape materials 3a and 3b. Furthermore, the first bending part 27a of the first carrier tape material 3a and the second bending part 27b of the second carrier tape material 3b are bent at substantially right angles, the same as described above, so that the bottom surface of the semiconductor chip 5 in the diagram and the first interposer 29a and second interposer 29b overlap. In this state, the apparatus is molded with a resin sealing material 31 with the outside of the semiconductor chip 5 and the carrier tape material 3 at a predetermined thickness, and a gap between the insides of the semiconductor chip 5 and the carrier tape. For this resin sealing, a transfer molding method in which a mold die is used, or a bonding method in which bonding resin is used, may be employed. Following this, the solder ball 15 is adhered and electrically connected to the land 17. In addition, the solder ball 15 may also be such that solder is attached to a copper ball to form a ball-shaped external adhesion terminal.

As described above, by making the dimensions of the device hole 11 smaller than the external shape of the semiconductor chip, it is possible to provide copper wiring 13 in the overlapping region of the carrier tape material 3 provided between the perimeter of the device hole 11 and the perimeter of the semiconductor chip 5, and it is possible to reduce use of carrier tape material 3 with respect to a single semiconductor apparatus 1. In addition, it is possible to greatly reduce the dimensions of a semiconductor apparatus 1 produced from this carrier tape material 3 and to reduce the mounting surface area. Furthermore, a first carrier tape material 3a and a second carrier tape material 3b with substantially the same length in the left-right direction in the diagram with respect to the semiconductor chip 5 are used, and hence it is possible to shorten the length of the wiring pattern and to improve the electrical properties of the semiconductor apparatus.

In addition, it suffices to bend the left and right the same in the short carrier tape material symmetric in the left-right direction, enabling simple production.

Figure 3:
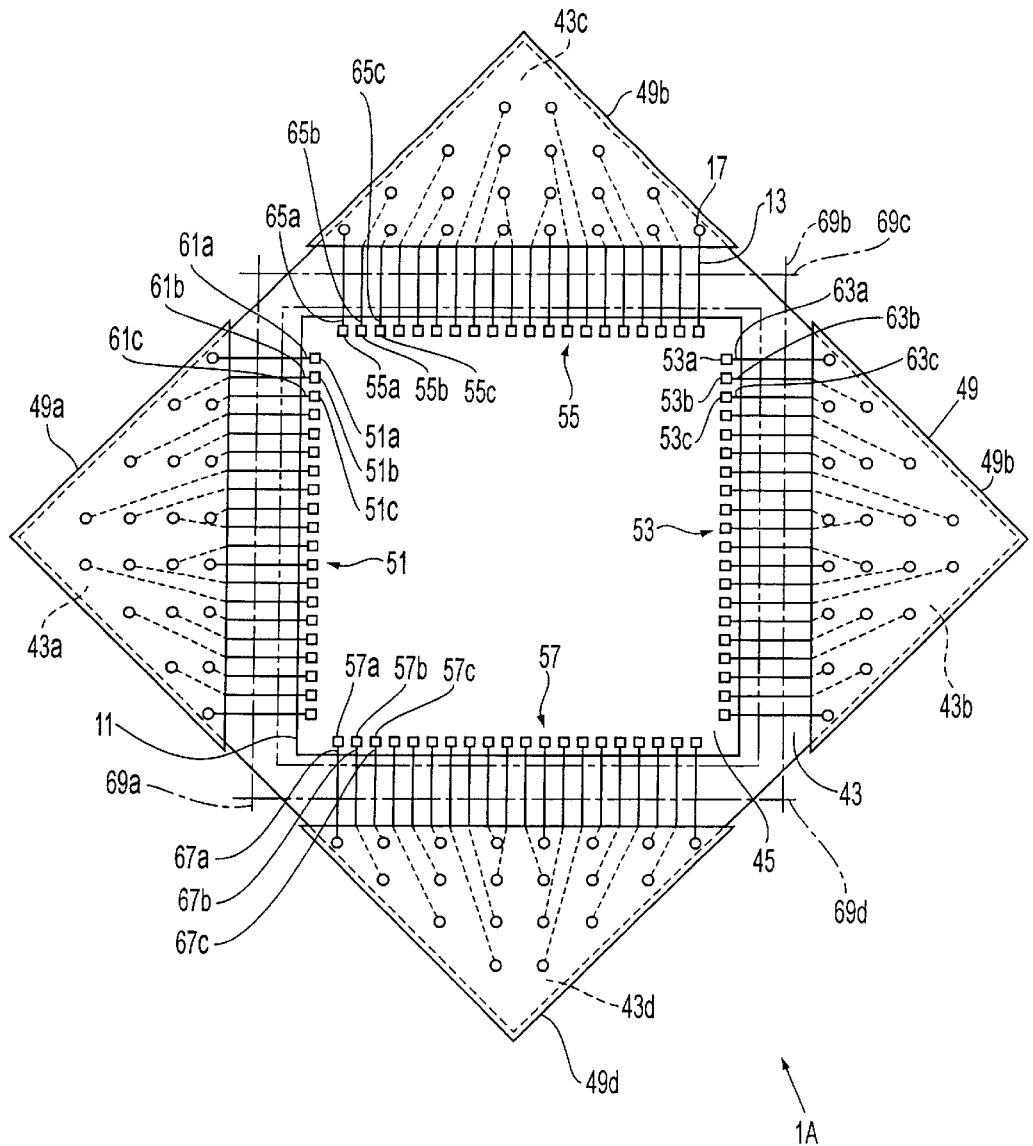
FIG. 3 is a planar view of a semiconductor apparatus according to a second embodiment of the present invention.
Figure 4:
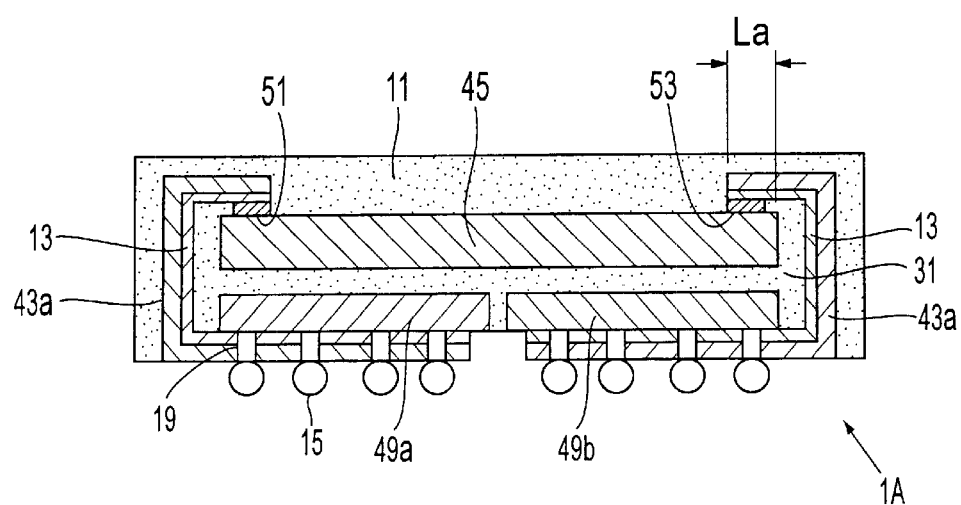
FIG. 4 is a side cross-sectional view of the semiconductor apparatus according to a second embodiment of the present invention.
Figure 5:
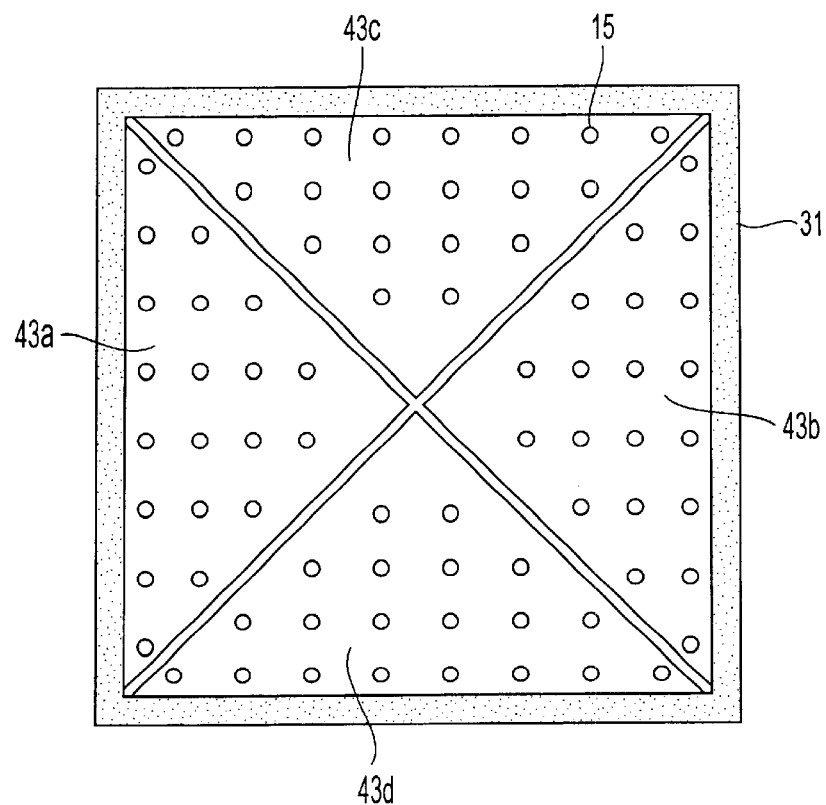
FIG. 5 is a post-assembly planar view of the semiconductor apparatus according to a second embodiment of the present invention.

FIG. 3 is a planar view of a semiconductor apparatus 1A according to a second embodiment of the present invention, FIG. 4 is a side cross-sectional view of the semiconductor apparatus 1A, and FIG. 5 is a post-assembly planar view of the semiconductor apparatus 1A.

In the semiconductor apparatus 1A of the second embodiment, a substantially square carrier tape material 43 is used, and a substantially square semiconductor chip 45 is positioned substantially in the center thereof, rotated by 90 degrees, and triangular interposers 49 protruding from the four edges of this semiconductor chip 45 are positioned so as to be freely bendable.

In FIG. 3 and FIG. 4, the semiconductor chip 45 is electrically connected and mounted substantially in the center of the carrier tape material 43. This semiconductor chip 45 is formed in a substantially square shape, and near each edge thereof has a plurality of electrodes 51, 53, 55 and 57. These electrodes 51, 53, 55 and 57 are arranged for example so that first electrodes 51a, 51b, 51c and so forth are on the left side in the diagram, second electrodes 53a, 53b, 53c and so forth are on the right side, third electrodes 55a, 55b, 55c and so forth are on the top side and fourth electrodes 57a, 57b, 57c and so forth are on the bottom side.

Similar to the first embodiment, a device hole 11 that overlaps with the position of the semiconductor chip 45 is formed in the bottom surface of the carrier tape material 43 on which the semiconductor chip 45 is mounted. As shown in FIG. 4, the dimensions of this device hole 11 are smaller than the external shape of the semiconductor chip 45, and the semiconductor chip 45 and the device hole 11 overlap by a predetermined dimension La and are electrically connected. Through this, the external shape can be compact, the same as in the first embodiment.

Similar to the first embodiment, on the carrier tape material 43, copper wiring 13 is formed at one edge side and land 17 is formed on which the below-described solder ball 15 is formed at the other edge side, and the materials and structure of these are the same as in the first embodiment, so detailed description is omitted here.

The copper wiring 13 forms a predetermined wiring pattern by forming copper foil on an edge of an insulating flexible film, and one end thereof connects to the plurality of electrodes 51, 53, 55 and 57 corresponding to the semiconductor chip 45, and consequently inner leads 61, 63, 65, and 67 are provided so as to project inwardly over the edge of the perimeter of the device hole 11 that is formed in a square shape. The inner leads 61, 63, 65 and 67 are such that first inner leads 61a, 61b, 61c and so forth are provided on the left side in the diagram, second inner leads 63a, 63b, 63c and so forth are provided on the right side in the diagram, third inner leads 65a, 65b, 65c and so forth are provided on the top side in the diagram and fourth inner leads 67a, 67b, 67c and so forth are provided on the bottom side in the diagram.

With this copper wiring 13, it is also possible to form a conductive film on the surface of a flexible film, the same as in the above-described first embodiment.

This carrier tape material 43 is for example connected in a triangular shape interposing each edge of the square-shaped semiconductor chip 45 positioned substantially in the center thereof, as shown in FIG. 3.

That is to say, a first carrier tape material 43a is provided on the left side of the semiconductor chip 45 in the diagram, a second carrier tape material 43b is provided on the right side, a third carrier tape material 43c is provided on the top side and a fourth carrier tape material 43d is provided on the bottom side. A first bending part 69a is formed in the first carrier tape material 43a, a second bending part 69b is formed in the second carrier tape material 43b, a third bending part 69c is formed in the third carrier tape material 43c, and a fourth bending part 69d is formed in the fourth carrier tape material 43d. This copper wiring 13 is produced by TAB (Tape Automated Bonding) or wire bonding technology, the same as described above. In addition, in the respective triangular edges of each carrier tape material 43, a first interposer 49a, a second interposer 49b, a third interposer 49c and a fourth interposer 49d are anchored by an unrepresented adhesive agent.

As described above, the semiconductor apparatus 1A is produced through the following sequence of procedures. First, as described above, the semiconductor chip 45 is mounted at a position overlapping with the device hole 11 provided in the carrier tape material 43. In addition, the plurality of electrodes 51, 53, 55 and 57 lined up near each edge of the semiconductor chip 45 and the copper wiring of the carrier tape material 43 are electrically connected using TAB technology or wire bonding technology.

On each of the triangular edges of the carrier tape material 43, each interposer 49 is anchored by an unrepresented adhesive agent 49. Next, the first bending part 69a of the first carrier tape material 43a, the second bending part 69b of the second carrier tape material 43b, the third bending part 69c of the third carrier tape material 43c, and the fourth bending part 69d of the fourth carrier tape material 43d provided on each edge of the semiconductor chip 5 are bent at substantially right angles so that the semiconductor chip 45 is housed between the insides of the carrier tape materials 43a, 43b, 43c and 43d. Furthermore, similar to the above description, these are bent at substantially right angles so that the bottom surface of the semiconductor chip in the diagram 45 and the first interposer 49a, the second interposer 49b, the third interposer 49c and the fourth interposer 49d overlap. Through this, as shown in FIG. 5, triangular-shaped first carrier tape material 43a, second carrier tape material 43b, third carrier tape material 43c and fourth carrier tape material 43d connected on each edge become a single planar surface, and the semiconductor chip 45 is housed between the insides of the carrier tape materials 43a, 43b, 43c and 43d. In this state, the result is molded with a resin sealing material 31 with the outside of the semiconductor chip 45 and the carrier tape material 43 at a predetermined thickness, and a gap between the insides of the semiconductor chip 45 and the carrier tape. For this resin sealing, a transfer molding method in which a mold die is used, or a bonding method in which bonding resin is used, may be employed. Following this, the solder ball 15 is adhered and electrically connected to the land 17. In addition, the solder ball 15 may also be such that solder is attached to a copper ball to form a ball-shaped external adhesion terminal.

As described above, by making the dimensions of the device hole 11 smaller than the external shape of the semiconductor chip 45, it is possible to provide copper wiring 13 in the overlapping region of the carrier tape material 43 provided between the perimeter of the device hole 11 and the perimeter of the semiconductor chip 45, and it is possible to reduce use of carrier tape material 43 with respect to a single semiconductor apparatus 1A, the same as in the first embodiment. In addition, it is possible to greatly reduce the dimensions of a semiconductor apparatus 1A produced from this carrier tape material 43 and to reduce the mounting surface area.

Furthermore, a first carrier tape material 43a, a second carrier tape material 43b, a third carrier tape material 43c and a fourth carrier tape material 43d having substantially the same length in the left-right and up-down directions in the diagram with respect to the semiconductor chip 45 are used, and hence it is possible to shorten the length of the wiring pattern and to improve the electrical properties of the semiconductor apparatus. In addition, it suffices to bend the left and right the same in the short carrier tape material symmetric in the left-right and/or up-down direction, enabling simple production.

Figure 6:
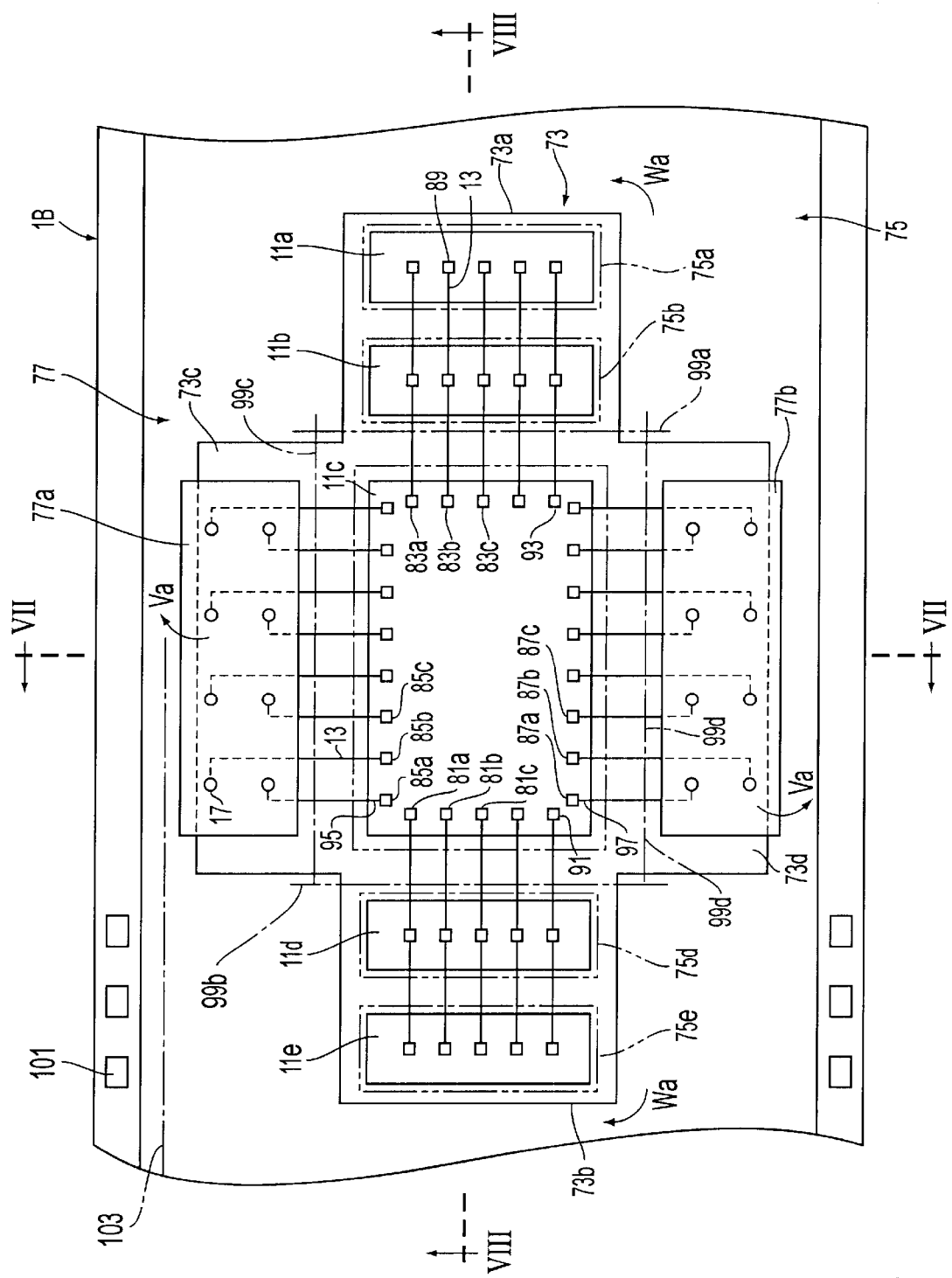
FIG. 6 is a planar view of a semiconductor apparatus according to a third embodiment of the present invention.
Figure 7:
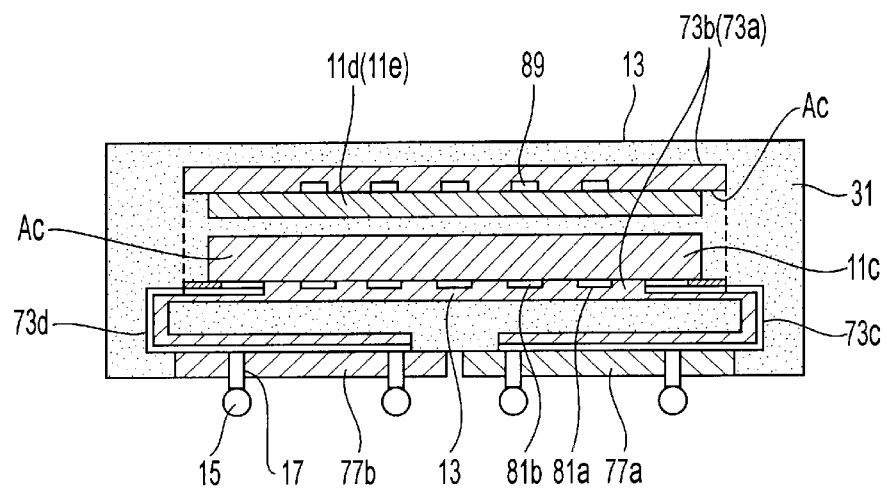
FIG. 7 is a cross-sectional view of the semiconductor apparatus according to a third embodiment of the present invention, taken along line VII–VII' in FIG. 6.
Figure 8:
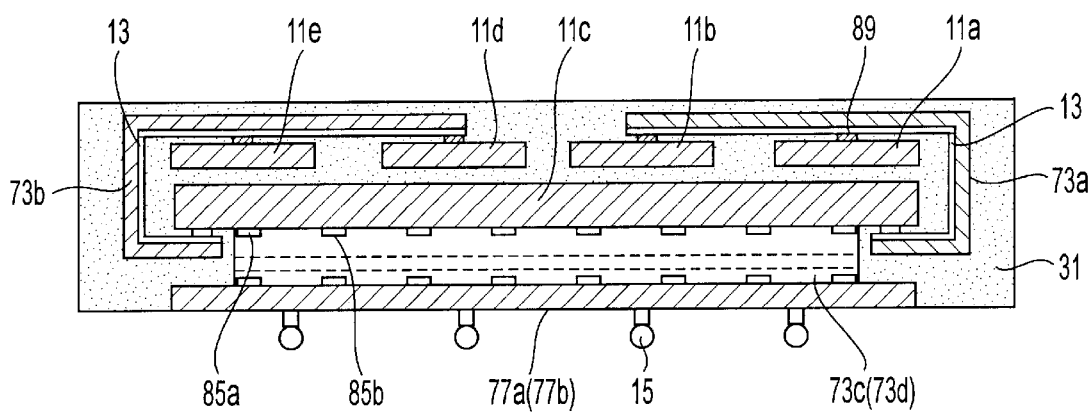
FIG. 8 is a cross-sectional view of the semiconductor apparatus according to a third embodiment of the present invention, taken along line VIII–VIII' in FIG. 6.

FIG. 6 is a planar view of a semiconductor apparatus 1B according to a third embodiment of the present invention, FIG. 7 is a cross-sectional view of the semiconductor apparatus 1B taken along line VII–VII' in FIG. 6 and FIG. 8 is a cross-sectional view of the semiconductor apparatus 1B taken along line VIII–VIII' in FIG. 6.

With the third embodiment, an example of a semiconductor apparatus 1B having a tape bending stack will be described.

In FIGS. 6 through 8, the semiconductor apparatus 1B is such that a plurality (five, in the case of the present embodiment) of semiconductor chips 75 are mounted in the left and right directions on the carrier tape material 73, and interposers 77 are mounted in the top and bottom directions in the diagram. In the case of the present embodiment, the semiconductor chips 75 are labeled, in order from the right side of the diagram, first semiconductor chip 75a, second semiconductor chip 75b, third semiconductor chip 75c, fourth semiconductor chip 75d and fifth semiconductor chip 75e. In addition, the interposers are labeled with top interposer 77a above and bottom interposer 77b below the third semiconductor chip 75c.

The third semiconductor chip 75c which is placed substantially in the center of the carrier tape material 73 is formed in a substantially rectangular shape, and has a plurality of electrodes 81, 83, 85 and 87 in rows near the sides thereof. These electrodes 81, 83, 85 and 87 are positioned such that, for example, first electrodes 81a, 81b, 81c and so forth are on the left side in the diagram, second electrodes 83a, 83b, 83c and so forth are on the right side, third electrodes 85a, 85b, 85c and so forth are on the top side and fourth electrodes 87a, 87b, 87c and so forth are on the bottom side. In addition, a plurality of electrodes 89 are lined up in a single row in the centers of the first semiconductor chip 75a, the second semiconductor chip 75b, the fourth semiconductor chip 75d and the fifth semiconductor chip 75e, and each electrode 89 is electrically connected with the respective copper wiring 13 by bumps.

Similar to the first embodiment, a plurality (five, in the case of the present embodiment) of device holes 11 are formed in the bottom surface of the carrier tape material 73 where each of the semiconductor chips 75 is mounted. In the case of the present embodiment, these device holes 11 are labeled, in order from the right side of the diagram, first device hole 11a, second device hole 11b, third device hole 11c, fourth device hole 11d and fifth device hole 11e. These devices holes 11 are formed smaller than the external dimensions of the semiconductor chips 75, and in the present invention the semiconductor chips 75 and the device holes 11 are overlapped by a preset dimension La and are electrically connected. Through this, it is possible to make the semiconductor apparatus 1 compact. In addition, the device holes 11 may conversely be made larger than the semiconductor chips 75, with the semiconductor chips anchored by an unrepresented adhesive agent.

When the external dimensions of the first semiconductor chip 75a and the second semiconductor chip 75b are the same, the first device hole 11a and the second device hole 11b are formed as device holes with the same dimensions. In addition, when the external dimensions of the first semiconductor chip 75a and the second semiconductor chip 75b are different, the first device hole 11a and the second device hole 11b are formed as device holes with different dimensions.

The device holes 11 are similarly formed, although the explanations are omitted below.

In the present embodiment, five semiconductor chips are provided as described above, but this is intended to be illustrative and not limiting, for it would also be fine to have two, three or four or more such chips.

Similar to the first embodiment, copper wiring 13 is formed on one edge side on the carrier tape material 73. In addition, the land 17 on which is formed a below-described solder ball 15 on the other edge side is formed on the copper wiring 13 connected to the third electrodes 85a, 85b, 85c and so forth provided on the top side of the third semiconductor chip 75c, and the fourth electrodes 87a, 87b, 87c and so forth on the bottom side.

In addition, other materials and structures of the carrier tape material 73 are the same, so detailed description of such is omitted here.

The copper wiring 13 forms a predetermined wiring pattern by forming copper foil on an edge of an insulating flexible film, and one end thereof connects to the plurality of electrodes 81, 83, 85 and 87 corresponding to the third semiconductor chip 75c, and consequently inner leads 91, 93, 95 and 97 are provided so as to project inwardly over the edge of the perimeter of the third device hole 11c that is formed in a rectangular shape. The inner leads are such that first inner lead 91 is provided on the left side in the diagram, the second inner lead 93 is provided on the right side in the diagram, the third inner lead 95 is provided on the top side in the diagram and fourth inner lead 97 is provided on the bottom side in the diagram. This copper wiring 13 can also be made by forming a conductive film on the surface of a flexible film, the same as in the above-described first embodiment.

This carrier tape material 73 is, for example as shown in FIG. 6, connected to the rectangular semiconductor chip 75 positioned in the sideways direction substantially in the center, and to the top interposer 77a and the bottom interposer 77b positioned to the top and the bottom in the diagram of the third semiconductor chip 75c positioned substantially in the center, and forms a cross shape. That is to say, the first carrier tape material 73a is provided to the right side of the third semiconductor chip 75c in the diagram, the second carrier tape material 73b is provided to the left side, the third carrier tape material 73c is provided to the top side and the fourth carrier tape material 73d is provided to the bottom side.

A first bending part 99a is formed in the first carrier tape material 73a, a second bending part 99b is formed in the second carrier tape material 73b, a third bending part 99c is formed in the third carrier tape material 73c, and a fourth bending part 99d is formed in the fourth carrier tape material 73d. This copper wiring 13 is produced, for example, by TAB (Tape Automated Bonding) or wire bonding technology, the same as described above. Next, the area of perforations 101 in the carrier tape material 3 is cut out along the dotted line 103.

As described above, the semiconductor apparatus 1B is produced through the following sequence of procedures. First, as described above, each of the semiconductor chips 75 is mounted at a position overlapping with the device holes 11 provided in the carrier tape material 73. In addition, the plurality of electrodes 81, 83, 85 and 87 lined up near each edge of the semiconductor chips 75 and the copper wiring 13 of the carrier tape material 73 are electrically connected using TAB technology or wire bonding technology. On each edge of the cross shape of the carrier tape material 73 centered about the third semiconductor chip 75c, the first semiconductor chip 75a, the second semiconductor chip 75b, the fourth semiconductor chip 75d and the fifth semiconductor chip 75e, along with the top interposer 77a and the bottom interposer 77b are anchored by an unrepresented adhesive. At this time, each of the electrodes 89 of the central part of the first semiconductor chip 75a, the second semiconductor chip 75b, the fourth semiconductor chip 75d and the fifth semiconductor chip 75e are electrically connected with the respective copper wiring 13 by bumps.

Next, the first bending part 99a of the first carrier tape material 73a and the second bending part 99b of the second carrier tape material 73b provided on the right and left sides of the semiconductor chip 75c are rotated in the upward direction in the diagram (indicated by arrow Wa), and the first semiconductor chip 75a, the second semiconductor chip 75b, the fourth semiconductor chip 75d and the fifth semiconductor chip 75e are overlapped in a single row with respect to the third semiconductor chip 75c.

Next, the third bending part 99c of the third carrier tape material 73c and the fourth bending part 99d of the fourth carrier tape material 73d are rotated in the downward direction in the diagram (indicated by arrow Va), and the top interposer 77a and the bottom interposer 77b are overlapped in a single row with respect to the third semiconductor chip 75c.

That is to say, through this, the third semiconductor chip 75c is housed on the inside with the first semiconductor chip 75a, the second semiconductor chip 75b, the fourth semiconductor chip 75d and the fifth semiconductor chip 75e overlapping it on the top side in the diagram, and the top interposer 77a and the bottom interposer 77b overlapping it on the bottom side in the diagram. At this time, bending is accomplished only one time, and a large semiconductor chip is overlapped by a plurality of small semiconductor chips, resulting in an apparatus that is compact yet which can be produced with ease. In this state, the apparatus is molded with a resin sealing material 31 with the outer sides of the semiconductor chip 75 and the carrier material 73 at a predetermined thickness, and a gap between the insides of the semiconductor chip 75 and the carrier tape material 73. For this resin sealing, a transfer molding method in which a mold die is used, or a bonding method in which bonding resin is used, may be employed. Following this, the solder ball 15 is adhered and electrically connected to the land 17. In addition, the solder ball 15 may also be such that solder is attached to a copper ball to form a ball-shaped external adhesion terminal.

In addition, in the above description, it would be fine for the active surfaces (Ac) of the first semiconductor chip 75a, the second semiconductor chip 75b, the fourth semiconductor chip 75d and the fifth semiconductor chip 75e, for example, to be placed flat on the top side of the diagram, and next for the active surface of the third semiconductor chip 75c to be placed flat on the bottom side, and for these to be separated and overlapped such that the third semiconductor chip 75c and the other first semiconductor chip 75a, second semiconductor chip 75b, fourth semiconductor chip 75d and fifth semiconductor chip 75e do not have facing active surfaces.

Through this, the semiconductor apparatus 1B in the case of a tape bending-type stack is stacked without the active surfaces facing each other, and hence the temperatures of the semiconductor chips 5 do not mutually act on each other, operations continue normally and the occurrence of abnormal operations can be prevented. In addition, because the apparatus is stacked without the carrier tape material 3 being interposed between the semiconductor chips 5, the apparatus can be made compact while the heat radiation from the semiconductor chips 5 is improved because there is no carrier tape material 3 with poor heat transfer ratio there, so the semiconductor apparatus 1B functions normally, and the occurrence of abnormal operations can be prevented.

With the semiconductor apparatus 1B developed as described above, by making the dimensions of the device hole 11 smaller than the external shape of the semiconductor chip 45, it is possible to provide copper wiring 13 in the overlapping region of the carrier tape material 13 provided between the perimeter of the device hole 11 and the perimeter of the semiconductor chip 75, and it is possible to reduce use of carrier tape material 73 with respect to a single semiconductor apparatus 1B, the same as in the first embodiment. In addition, it is possible to greatly reduce the dimensions of a semiconductor apparatus 1B produced from this carrier tape material 73 and to reduce the mounting surface area. Furthermore, a first carrier tape material 73a, a second carrier tape material 73b, a fourth carrier tape material 73d and a fifth carrier tape material 73e with substantially the same length in the left-right direction in the diagram with respect to the semiconductor chip 75 are used, and hence it is possible to shorten the length of the wiring pattern and to improve the electrical properties of the semiconductor apparatus 1B. In addition, it suffices to bend left and right similarly in the short carrier tape material symmetric in the left-right direction and/or the top-bottom direction, enabling simple production.

Figure 9:
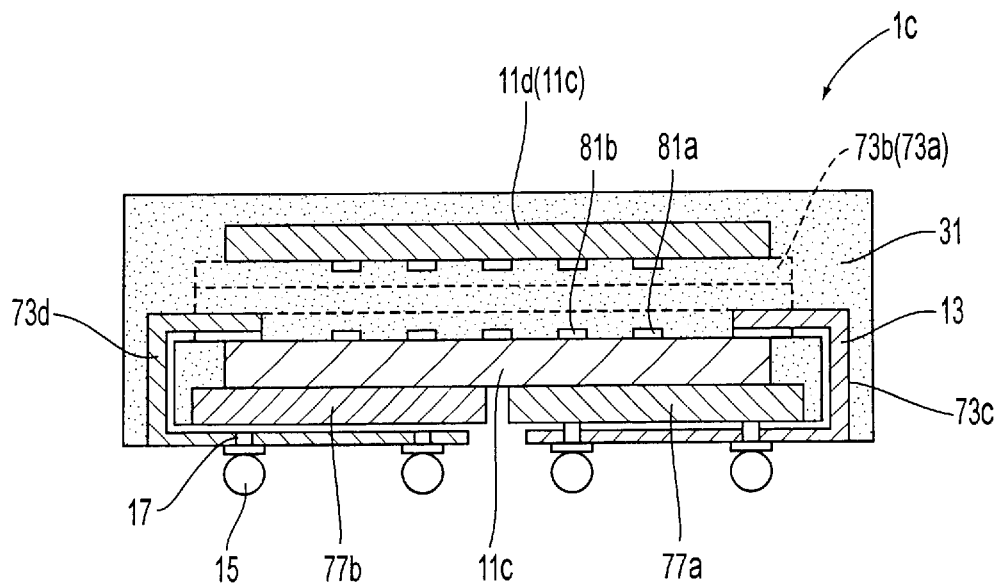
FIG. 9 is a side cross-sectional view of a semiconductor apparatus according to a fourth embodiment of the present invention.
Figure 10:
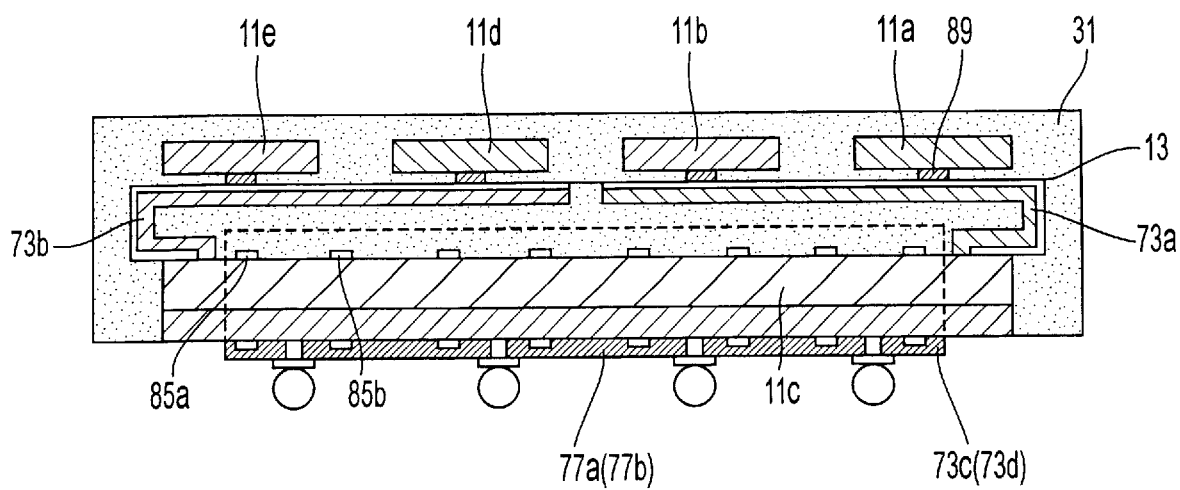
FIG. 10 is a front cross-sectional view of a semiconductor apparatus according to a fourth embodiment of the present invention.
Figure 11:
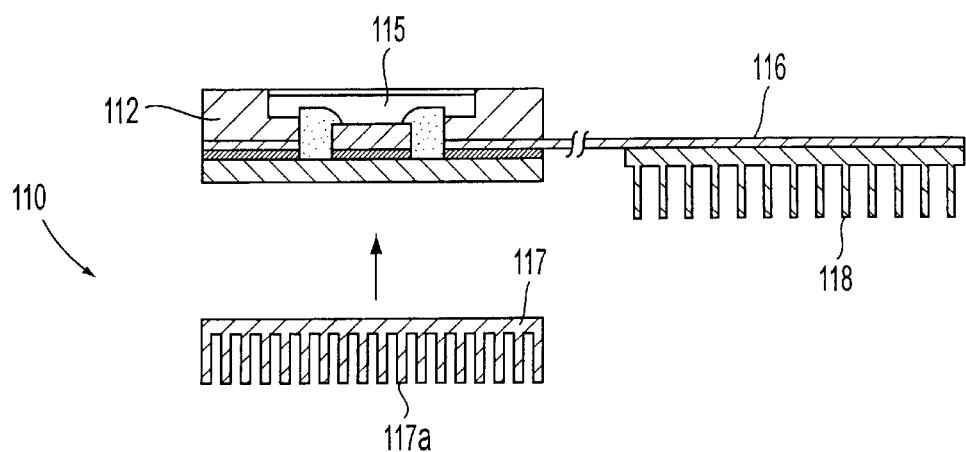
FIG. 11 is a diagram explaining the method of producing a semiconductor apparatus using a conventional flexible wiring board.
Figure 12:
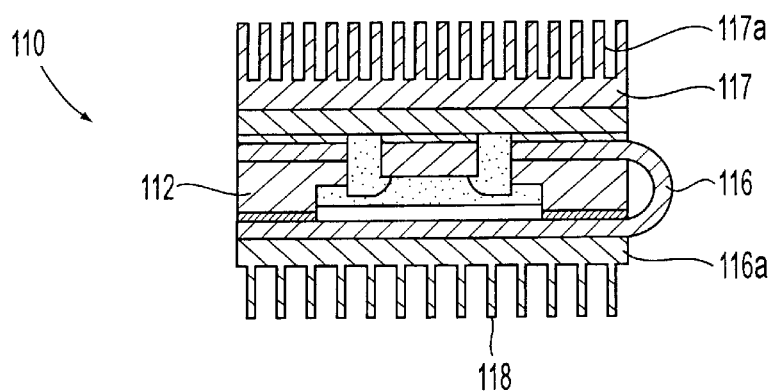
FIG. 12 is a diagram showing the composition of a semiconductor apparatus using a conventional flexible wiring board.

FIG. 9 is a side cross-sectional view of a semiconductor apparatus 1C according to a fourth embodiment of the present invention, and FIG. 10 is a front cross-sectional view of this semiconductor apparatus. The semiconductor apparatus 1C according to the fourth embodiment is a variation on that of the third embodiment, with the spacing of the semiconductor chips 75 and the position of the carrier tape materials 73 connecting the interposers 77 differing.

With the third embodiment, in FIG. 6 the carrier tape material 73 is provided with the copper wiring 13 on the top surface, and on top of that are mounted the first semiconductor chip 75a, the second semiconductor chip 75b, the third semiconductor chip 75c, the fourth semiconductor chip 75d and the fifth semiconductor chip 75e, along with the top interposer 77a and the bottom interposer 77b. The semiconductor apparatus 1B thus developed is such that the first semiconductor chip 75a, the second semiconductor chip 75b, the fourth semiconductor chip 75d and the fifth semiconductor chip 5e are rotated facing in the upward direction in the diagram (indicated by arrow Wa) centered about the third semiconductor chip 75c. In addition, the top interposer 77a and the bottom interposer 77b are rotated in the downward direction in the diagram (indicated by arrow Va), centered about the third semiconductor chip 75c.

In contrast, with the semiconductor apparatus 1C of the fourth embodiment, in FIG. 9 the carrier tape material 73 is positioned with the copper wiring 13 on the bottom surface, and on the bottom of that are mounted the first semiconductor chip 75a, the second semiconductor chip 75b, the third semiconductor chip 75c, the fourth semiconductor chip 75d and the fifth semiconductor chip 75e, along with the top interposer 77a and the bottom interposer 77b. The semiconductor apparatus 1C thus developed is rotated the same as in the third embodiment. Through this, with the semiconductor apparatus 1C, it is possible to position the top interposer 77a and the bottom interposer 77b touching the bottom surface of the third semiconductor chip 75c. In addition, it is possible to provide the first semiconductor chip 75a, the second semiconductor chip 75b, the third semiconductor chip 75c, the fourth semiconductor chip 75d and the fifth semiconductor chip 5e with a predetermined spacing. Consequently, with the semiconductor apparatus 1C of the fourth embodiment, the interposers 77 and the third semiconductor chip 75c are provided so as to touch, and hence the apparatus can be more compact than the semiconductor apparatus 1C of the third embodiment. In addition, it is also possible to arrange the active surfaces of the semiconductor chips 75 not facing each other, so that it is possible to prevent rises in temperature.

Possibilities for Use in Industry

With the present invention as described above, the structure is such that a semiconductor chip electrically connected to wiring form on a carrier tape, and an interposer on the carrier tape and next to the semiconductor chips, are provided next to each other, and furthermore, the semiconductor chip and interposer are overlapped by bending the carrier tape so that the semiconductor chip positioned in the center is enclosed inside, and the result is then covered with molding resin. Through this, it is possible to manufacture a carrier tape material with substantially the same length in the left-right and/or front-back direction in the diagram with respect to the semiconductor chip in the center, and consequently it is possible to shorten the length of the wiring pattern and to improve the electrical properties. In addition, it suffices to bend the left and right of the short carrier tape the same, symmetric to the left and right, enabling simple production.

In addition, when the present invention is given a structure wherein interposers are provided on the carrier tape and also on both the top and bottom sides of the semiconductor chip positioned at the center, and the apparatus is stacked up by bending the carrier tape and overlapping the interposers on one surface of the semiconductor chip in the center and semiconductor chips on the other surface, as described above, the apparatus has carrier tape with substantially the same length in the up-down direction, and consequently it is possible to shorten the length of the wiring pattern and to improve the electrical properties, and in addition it is possible to make the apparatus compact because adjacent positioning of the carrier tape and interposers is possible.

In addition, when interposers on the tape material adjacent to the provided semiconductor chips are positioned on the carrier tape and an external connection terminal is provided to the interposers, because an external connection terminal is provided to the interposers, the interposers are reinforced by the external connection terminal, and wiring in a single layer becomes good and costs become less expensive.

In addition, when the active surfaces of the semiconductor chips are stacked up by being overlapped in the up-down direction while not facing each other, the heat generated from the active surfaces of the semiconductor chips does not mutually act to cause the temperature to rise, so increases in the temperature of the chips are reduced. Consequently, the occurrence of abnormal operations in the semiconductor chips disappears, and it becomes possible for the semiconductor module to operate normally.

In addition, when there is no carrier tape between overlapped semiconductor chips, it is possible to reduce the gap between semiconductor chips by the amount of carrier tape that was omitted between the overlapping semiconductor chips, so the thickness of the semiconductor module can be made thinner and the apparatus can be made compact. Because there is no carrier tape provided, the heat radiation of the semiconductor chips improves, the temperature does not rise very much, and it is possible to prevent the occurrence of abnormal operation.

What is claimed is:

1. A semiconductor apparatus, comprising:
   a semiconductor chip electrically connected to wiring formed on a carrier tape; and
   interposers formed on the carrier tape and surrounding said semiconductor chip, the interposers being provided next to each other, each of the interposers having areas to form a plurality of external connection terminals, the semiconductor chip and interposers overlapping by bending the carrier tape such that the semiconductor chip, positioned in a center, is enclosed, and the enclosed semiconductor chip is covered by a molding resin.

2. The semiconductor apparatus of claim 1, an external connection terminal being provided to the interposers.

3. The semiconductor apparatus of claim 2, stacking being accomplished by placing an active surface of the semiconductor chip in an up-down direction.

4. A semiconductor apparatus, comprising:
   a plurality of semiconductor chips arranged in a row and electrically connected to wiring formed on a carrier tape; and
   a plurality of interposers formed on the carrier tape and on a top side and a bottom side of a semiconductor chip positioned in a center, the interposers overlapping, one surface of the semiconductor chip in the center while the semiconductor chips overlapping another surface, the enclosed semiconductor chip is covered by a molding resin, and external terminals are formed on the interposers.

5. The semiconductor apparatus of claim 4, the interposers on the tape material adjacent to the semiconductor chips being positioned on the carrier tape, and an external connection terminal being provided to the interposers.

6. The semiconductor apparatus of claim 5, stacking being accomplished by overlapping active surfaces of the semiconductor chips in an up-down direction so they do not face each other.

7. The semiconductor apparatus of claim 6, the carrier tape not being provided between the overlapped semiconductor chips.

* * * * *